US008957445B2

(12) United States Patent
Senellart et al.

(10) Patent No.: US 8,957,445 B2
(45) Date of Patent: Feb. 17, 2015

(54) LIGHT SENSORS AND SOURCES COMPRISING AT LEAST ONE MICROCAVITY WITH A LOCALIZED TAMM PLASMON MODE

(75) Inventors: Pascale Senellart, Orsay (FR); Aristide Lemaitre, Etampes (FR); Steffen Michaelis De Vasconcellos, Detmold (DE); Olivier Gazzano, Paris (FR); Joel Bellessa, Lyons (FR); Olivier Daniel, Champs sur Marne (FR)

(73) Assignees: Centre National de la Recherche Scientifique, Paris (FR); Universite Claude Bernard-Lyon 1, Villeurbanne (FR)

( * ) Notice: Subject to any disclaimer, the term of this patent is extended or adjusted under 35 U.S.C. 154(b) by 84 days.

(21) Appl. No.: 13/877,212

(22) PCT Filed: Sep. 28, 2011

(86) PCT No.: PCT/IB2011/054271
§ 371 (c)(1),
(2), (4) Date: Jun. 10, 2013

(87) PCT Pub. No.: WO2012/042485
PCT Pub. Date: Apr. 5, 2012

(65) Prior Publication Data
US 2013/0270596 A1    Oct. 17, 2013

(30) Foreign Application Priority Data

Sep. 30, 2010 (FR) ...................................... 10 03881

(51) Int. Cl.
*H01L 33/00* (2010.01)
*H01L 33/58* (2010.01)
(Continued)

(52) U.S. Cl.
CPC ................ *H01L 33/58* (2013.01); *B82Y 20/00* (2013.01); *H01L 31/02325* (2013.01);
(Continued)

(58) Field of Classification Search
USPC .................................................... 257/E33.069
See application file for complete search history.

(56) References Cited

U.S. PATENT DOCUMENTS 5,877,509 A    3/1999 Pau et al.

OTHER PUBLICATIONS

Gazzano, O., S. Michaelis de Vasconcellos, K. Gauthron, C. Symonds, J. Bloch, P. Voisin, J. Bellessa, A. Lemaitre, and P. Senellart, "Evidence for Confined Tamm Plasmon Modes under Metallic Microdisks and Application to the Control of Spontaneous Optical Emission", Physical Review Letters, PRL 107, 247402, Dec. 9, 2011.*
Symonds, C. et al., "Emission of Tamm plasmon/exciton polaritons," Applied Physics Letters, American Institute of Physics, vol. 95, No. 15, pp. 151114-1 to 151114-3, (2009), XP012126038.
Sasin, M.E., et al., "Tamm plasmon-polaritons: First experimental observation," Superlattices and Microstructures, Elsevier, vol. 47, pp. 44 to 49, (2010), XP026816887.

(Continued)

*Primary Examiner* — Daniel Luke
(74) *Attorney, Agent, or Firm* — Oblon, Spivak, McClelland, Maier & Neustadt, L.L.P.

(57) ABSTRACT

A light source or sensor including: a stack of dielectric or semiconductive layers includes an alternation in a vertical direction of layers of high refractive index and of low refractive index forming an interference mirror, and presenting a top layer of high refractive index; at least one first metal pellet deposited or transferred on the top layer of the stack of layers to form a structure supporting a first Tamm plasmon mode that is spatially localized in at least one lateral direction perpendicular to the vertical direction; and at least one light emitter or detector arranged inside the stack of layers under the metal pellet and at a depth corresponding to a local maximum of the electric field of the Tamm plasmon mode to emit or detect radiation at the resonant wavelength thereof.

15 Claims, 5 Drawing Sheets

(51) Int. Cl.
*B82Y 20/00* (2011.01)
*H01L 31/0232* (2014.01)
*H01L 31/0352* (2006.01)
*H01L 33/10* (2010.01)
*H01L 33/46* (2010.01)
*H01L 33/04* (2010.01)

(52) U.S. Cl.
CPC . *H01L 31/02327* (2013.01); *H01L 31/035209* (2013.01); *H01L 31/035236* (2013.01); *H01L 33/105* (2013.01); *H01L 33/465* (2013.01); *H01L 33/04* (2013.01)
USPC .................................... 257/98; 257/E33.069

(56) References Cited

OTHER PUBLICATIONS

Kaliteevski, M. et al., "Hybrid states of Tamm plasmons and exciton polaritons," Applied Physics Letters, American Institute of Physics, vol. 95, No. 25, pp. 251108-1 to 251108-3, (2009), XP012126899.
Sasin, M.E., et al., "Tamm plasmon-polaritons: Slow and spatially compact light," Applied Physics Letters, American Institute of Physics, vol. 92, No. 25, pp. 251112-1 to 251112-3, (2008), XP012107660.
International Search Report Issued Jan. 13, 2012 in PCT/IB11/54271 Filed Sep. 28, 2011.

\* cited by examiner

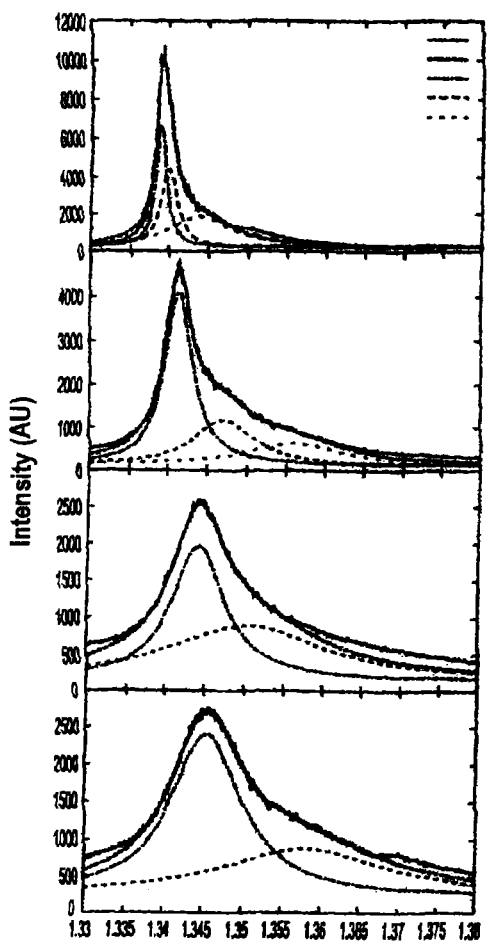
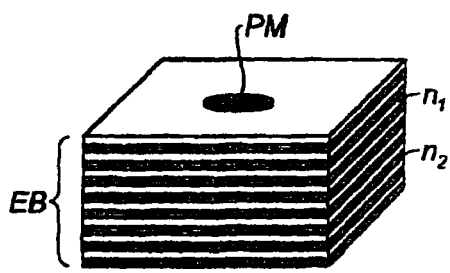
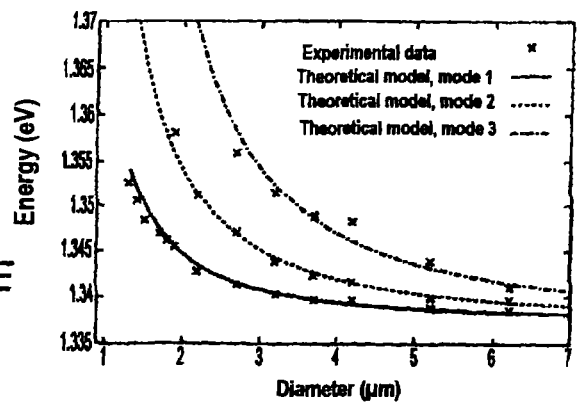
Fig. 4A
Fig. 4B
Fig. 4C
Fig. 4D
Fig. 3
Fig. 4E

LIGHT SENSORS AND SOURCES COMPRISING AT LEAST ONE MICROCAVITY WITH A LOCALIZED TAMM PLASMON MODE

The invention relates to a new family of solid state light sources of the type comprising at least one optical transducer coupled to an optical microcavity. The term "optical transducer" is used to mean any element capable of emitting and/or detecting light; a given element can often act either as an emitter or as a detector depending on its electrical bias. In the context of the present application, the term "light" should be understood broadly as including the infrared, specifically near, medium, and far infrared as far as the "terahertz" range (wavelength up to 1 millimeter (mm)), the visible (380 nanometers (nm)-780 nm), and the ultraviolet (400 nm-200 nm).

The invention applies to making light sensors, single photon sources, sources of polarization-entangled photon pairs, surface emission lasers, and miniature light-emitting diodes (LEDs). These various devices share a common general structure and they operate on the same principle that is based on using a particular type of surface plasmon-polariton, known under the name "Tamm plasmon mode", for the purpose of confining electromagnetic energy in two dimensions, or preferably in three dimensions.

Numerous components that are essential for modern optoelectronics and photonics are based on light emitters of nanometric size, in particular on quantum wells or dots, that are coupled with optical microcavities, in particular of the micropillar or microdisk type. The term "microcavity" is used to mean an optical resonator for which, as an indication, the mode volume lies in the range $\lambda^3$ to $100\lambda^3$, where $\lambda$ is the resonant wavelength. In the visible or the near infrared, this corresponds approximately to 1 cubic micrometer ($\mu m^3$) to $100 \mu m^3$, which justifies the term "microcavity".

FIG. 1A shows a micropillar type cavity made by etching a multilayer semiconductor structure. From the bottom upwards the structure comprises: a substrate SS, a first zone forming a Bragg mirror MB1, a quantum well or a stack of quantum wells QW, and a second zone forming a Bragg mirror MB2. The two Bragg mirrors confine light in the z direction; confinement in the x-y plane is obtained by the step in refractive index between the micropillar MP and the air that surrounds it, as in an optical fiber: this obtains a cavity with a volume of the order of a few $\mu m^3$, that traps light in three dimensions. The two Bragg mirrors MB1 and MB2 are made of P- and N-doped semiconductor materials respectively so as to form a diode. By applying forward bias to the diode, electrons and holes are injected into the quantum well QW which then emits light radiation. If the emission wavelength of the quantum well coincides with a resonance of the cavity, it is possible to obtain laser radiation from the surface of the micropillar. Because of the small size of its active volume, such a laser presents a threshold current that is much smaller than that of a conventional vertical cavity surface-emitting laser (VCSEL) that has lateral dimensions generally in excess of 100 micrometers ($\mu m$) and in which light is confined only in the vertical direction (z axis).

Micropillars containing a quantum dot as their active region are also used as emitters of single photons. Under such circumstances, the microresonator is used to encourage extraction of photons emitted by radiative cascade in the quantum dots, by making use of a phenomenon known as the "Purcell" effect. On this topic, reference may be made to the article by E. Moreau et al., "Single-mode solid-state photon source based on isolated quantum dots in pillar microcavities", Appl. Phys. Lett. 79, 2865 (2001), and the article by J.-M. Gérard and B. Gayral, "Strong Purcell effect for InAs quantum boxes in three-dimensional solid-state microcavities", J. Lightwave Technol. 17, 2089 (1999).

FIG. 1B shows a source of polarization-entangled photon pairs as described in the article by A. Dousse et al., "Ultrabright source of entangled photon pairs", Nature, Vol. 466, Jul. 8, 2010. That device uses a complex microcavity constituted by two micropillars MP1 and MP2 that are very close together, or indeed partially superposed, with only one of them containing a quantum dot BQ in its central portion. The use of two coupled microcavities serves to enhance the extraction of two polarization-entangled photons of different wavelengths without unfavorably affecting their entanglement. Such a device is very promising for quantum cryptography applications.

The devices of FIGS. 1A and 1B are very complex to make, not only because of the lithography step needed for defining the micropillars, but above all because of the difficulty of making small electrical contacts on structures of such small dimensions. This is particularly true since the contacts must not prevent light being emitted through the top surface of the device. The same problem arises for microcavities of other types, such as microdisks. In conventional VCSELs, the problem does not arise since it is easy to deposit an annular electrode on the surface of such a device since its dimensions are much greater.

The article by T. Heindel et al., "Electrically driven quantum dot-micropillar single photon source with 34% overall efficiency", Applied Physics Letters, 96(1):011107, 2010 describes the fabrication of a suspended annular electrode with only its inside edge coming into contact with the periphery of a micropillar. It is clear that such a structure is fragile, complex to make, and difficult to ensure a contact of good electrical quality.

The article by M. T. Hill et al., "Lasing in metallic-coated nanocavities", Nature Photonics, Vol. 1, pp. 589-594, October 2007 describes a nanocavity laser based on a pillar of sub-micrometric dimensions on which a coating of gold is deposited. The fabrication of such a device requires numerous technological steps.

The article by S. Strauf et al., "High-frequency single photon source with polarization control", Nature Photonics, Vol. 1, pp. 704-708, December 2007, suggests getting round the difficulty of making electrical contacts on micropillars by using a photonic structure constituted by holes made by etching and selective oxidation, surrounding an active region and confining light laterally.

That technique presents the advantage of making an optical microcavity in a device of "macroscopic" size (dimensions of the order of hundreds of micrometers), on which it is easy to make electrical contacts. A drawback of that technique lies in the difficulty of finely controlling the energy of the mode of the cavity by the oxidation technique.

Making electrical contacts on cavities of the microdisk type is even more difficult than on micropillars. In this respect, reference may be made to the article by L. Zhang and E. Hu, "Lasing from InGaAs quantum dots in an injection microdisk", Appl. Phys. Lett., Vol. 82, No. 3, pp. 319-321, Jan. 20, 2003.

With light sensors, the use of a microcavity makes it possible to trap photons and thus to increase their probability of interacting with a detector element.

The invention seeks to solve the above-mentioned drawbacks of the prior art.

In accordance with the invention, this object is achieved by a light source or sensor (or more generally an optical transducer) comprising:

- a stack of dielectric or semiconductive layers comprising an alternation in a "vertical" direction of layers of high refractive index and of low refractive index forming an interference mirror, and presenting a top layer of high refractive index;
- at least one first metal pellet deposited or transferred on said top layer of said stack of layers to form a structure supporting a first Tamm plasmon mode that is spatially localized in at least one lateral direction perpendicular to said vertical direction; and
- at least one light emitter or detector arranged inside said stack of layers under said metal pellet and at a depth corresponding to a local maximum of the electric field of said Tamm plasmon mode in order to emit or detect radiation at a resonant wavelength $\lambda$ thereof.

In various embodiments of the invention:

- Said or each metal pellet may present lateral dimensions that are less than or equal to $10\lambda$, and preferably less than or equal to $5\lambda$, so as to support a Tamm plasmon mode that is localized in three dimensions. Under such circumstances, the Tamm plasmon mode is confined to the region immediately under the pellet: this obtains lateral confinement of the light without any need to etch a micropillar or a photonic structure inside the stack of layers. For sources or sensors operating in the visible or in the near infrared, this three-dimensional confinement is obtained by using pellets having lateral dimensions of less than 10 µm, or indeed less than 5 µm.
- Said stack of layers may present lateral dimensions greater than or equal to $30\lambda$ and preferably greater than or equal to $100\lambda$ (about 30 µm or 100 µm for devices operating in the visible or the near infrared). This avoids technological difficulties associated with making and manipulating structures of micrometric or even sub-micrometric dimensions.
- Said or each metal pellet may present thickness greater than or equal to 40 nm.
- Said layers of said stack may be made of one or more semiconductor materials that are doped so as to establish electrical contact between said light emitter or detector and a first electrode. The metal pellet that provides the lateral confinement of the light then also serves as an electrode for electrically pumping the light emitter or for recovering the photocurrent generated by the detector.
- A conductive layer of thickness that is not sufficient for supporting said first Tamm plasmon mode may be deposited on said stack of layers. This layer may be in electrical contact with said pellet acting as an electrode, in which case it facilitates making electrical contacts. In any event, it serves to eliminate in effective manner the light that is emitted (sensed) by "parasitic" emitters (detectors).
- A dielectric layer may be deposited on said multilayer stack, the dielectric layer including an opening over said light emitter or detector, a metal layer being deposited over said dielectric layer in order to form said pellet at said opening. Advantageously, this variant makes it possible to eliminate in effective manner the light that is emitted (sensed) by "parasitic" emitters (detectors). In particular, said dielectric layer may be constituted by a photosensitive resin, thereby making the device simpler to make by making it possible to eliminate a technological step.
- Said light emitter or detector may be selected from a quantum dot, a quantum wire, and a quantum well, and it may be situated in the intrinsic region of a P-I-N junction.
- The light source of the invention may comprise a second metal pellet adjacent to said first metal pellet, or partially overlapping it, so as to form a structure supporting a second Tamm plasmon mode that is localized in three dimensions and that is coupled with said first Tamm plasmon mode ("photonic molecule"). Under such circumstances, said light emitter may advantageously be a quantum emitter presenting a ground state, two states with one elementary excitation, which states are degenerate and of different spins, and one state with two elementary excitations, and said first and second metal pellets may be selected to be of substantially circular shape and of chemical composition, size, and relative arrangement such as to enable them to support a first pair of Tamm plasmon modes that are polarization degenerate and resonant with the transitions between the state having two elementary excitations and the two degenerate states having one elementary excitation of the quantum emitter, and a second pair of Tamm plasmon modes that are polarization degenerate and resonant with the transitions between said degenerate states having one elementary excitation and the ground state, whereby said source may be capable of emitting pairs of photons that are polarization-entangled.
- Said metal pellet may be a connection pad on the surface of a chip on which said stack of layers forming an interference mirror with said light emitter is transferred.
- The source or sensor of the invention may have a plurality of pellets of different chemical compositions and/or thicknesses and/or lateral dimensions in order to form structures that support respective three-dimensionally localized Tamm plasmon modes at different frequencies, and quantum emitters or detectors placed under said pellets and resonant with said modes, whereby the component is capable of emitting or detecting polychromatic radiation.
- Said pellet may comprise a layer made of a first metal that is magnetic and magnetized, on which there is deposited a layer made of a second metal that is of higher conductivity. A layer of insulating material forming a tunnel barrier may also be provided under said layer made of a magnetized magnetic first metal. This makes it possible to provide a source of circularly polarized light by injecting a spin-polarized current.

Other characteristics, details, and advantages of the invention appear on reading the following description made with reference to the accompanying drawings given by way of example, and in which:

FIGS. 1A and 1B show light sources known in the prior art;

FIGS. 2A, 2B, and 2C show a structure supporting a two-dimensional Tamm plasmon mode;

FIG. 3 shows a structure supporting a "zero-dimensional" Tamm plasmon mode, i.e. confined in the three spatial dimensions in such a manner as to provide an optical microcavity;

FIGS. 4A to 4E are graphs illustrating the experimental verification of the reality of this confinement in three dimensions;

The invention is based on Tamm plasmon-polaritons, also known as Tamm plasmons, which are electromagnetic states that may form at the interface between an interference mirror and a metal. These states, which are named by analogy with the surface electron state predicted by the Soviet physician Tamm in 1932, have been discovered only very recently: see the article by M. Kaliteevski et al., "Tamm plasmon-polaritons: possible electromagnetic states at the interface of a metal and a dielectric Bragg mirror", Phys. Rev. B, 76, 165415 (2007).

Figure 1A:
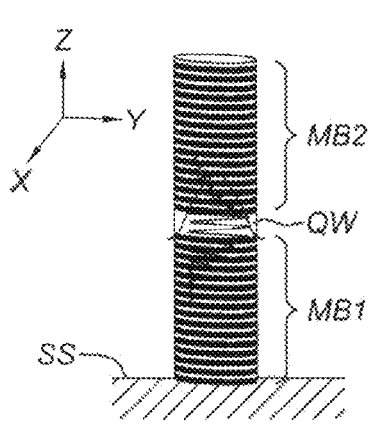
Figure 1B:
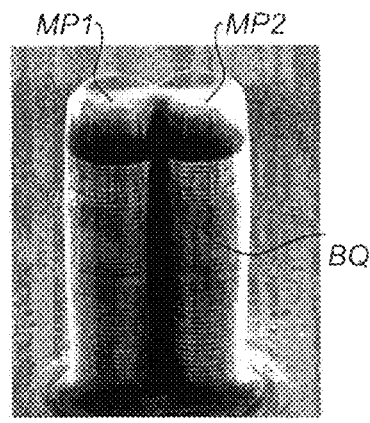
Figure 2A:
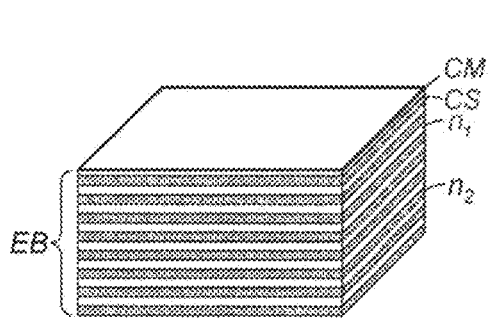

FIG. 2A shows a structure that can support a Tamm plasmon mode. This structure essentially comprises a stack of dielectric or semiconductive layers having refractive indices $n_1$ and $n_2$ ($n_1 > n_2$) forming an interference mirror (reference EB) and a metal layer CM having a thickness of 50 nm deposited on the surface of the stack. The top layer CS of the stack has high refractive index. For simplicity, it is assumed that the stack EB is perfectly periodic (a Bragg mirror), even if that is not really essential; on the contrary departures from a structure that is exactly periodic may be introduced deliberately in order to achieve fine adjustment over the energy of the Tamm mode and its spatial distribution. The stack may even have layers presenting a plurality of different refractive indices; the essential point is that it presents alternating layers of "high" index and layers of "low" index, and the top layer is of "high" index.

Figure 2B:
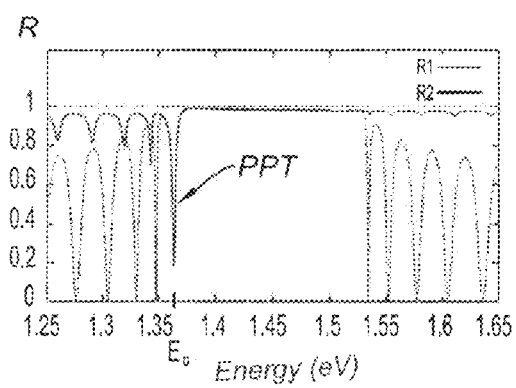

In FIG. 2B, the continuous line curve R2 shows the reflectivity R of the FIG. 2A structure as a function of the energy of the radiation ($E = hc/\lambda$ where h is Planck's constant, c is the speed of light, and $\lambda$ is the wavelength), while the dotted-line curve R1 shows the reflectivity R of the interference mirror in the absence of the metal layer CM. It can be seen that the metal coating leads to a reflectivity drop appearing at an energy $E_0$ close to the lower limit of the forbidden band (high reflectivity band) of the interference mirror. This reflectivity drop, identified by the reference PPT in the figure, corresponds to the resonance condition of a so-called "Tamm" plasmon-polariton.

Figure 2C:
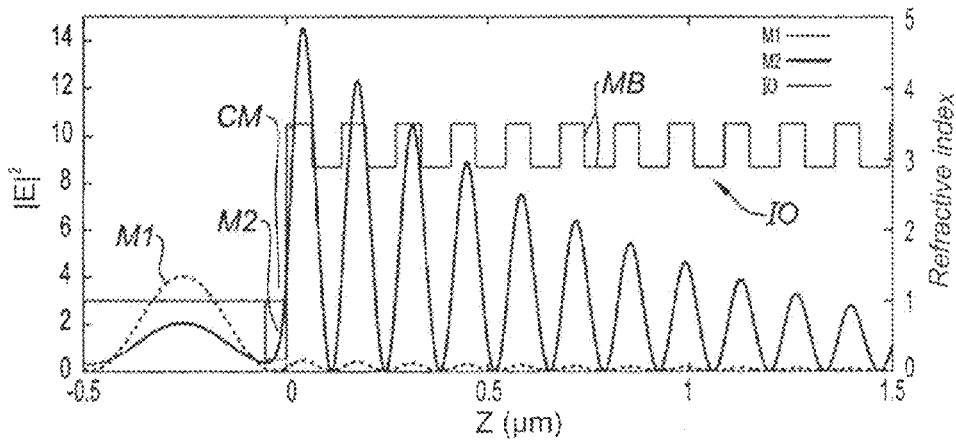

FIG. 2C shows the modulus squared of the electric field inside the FIG. 2A structure as a function of the depth z at the resonance $E_0$, both with the metal layer (continuous line M2) and without it (dotted line M1). The line 10 illustrates the variation in the real portion of the refractive index inside the structure: the crenellations of the interference mirror MB, the metal layer CM presenting a complex index in which the real portion is much less than 1, followed by ambient air of substantially unit index.

In the absence of a metal layer, the electric field penetrates very little into the mirror and remains essentially confined in the ambient medium (air), where a standing wave is established. The presence of the layer CM changes this situation radically: the field penetrates much more deeply into the multilayer stack and presents a pronounced maximum at several tens of nanometers under its surface.

FIG. 2C shows that a Tamm plasmon mode confines the electromagnetic energy in a region of about 1 µm to 2 µm (more generally; of the order of the wavelength $\lambda$) beneath the metal layer CM. Confinement occurs only in the z direction; this can thus be said to be "two-dimensional Tamm plasmon mode". This confinement effect is known from the above-mentioned article by M. Katliteevski et al.

The article by C. Symonds et al., "Emission of Tamm plasmon/exciton polaritons", Appl. Phys. Lett. 95, 151114 (2009) describes a device constituted by a Bragg mirror containing quantum wells, and on which a metal layer is deposited. The authors observed light emission with large angular dispersion, and they attribute that to strong coupling between the two-dimensional Tamm modes and the excitons of the quantum wells.

An idea on which the present invention is based is that Tamm plasmon modes can produce three-dimensional confinement of light without it being necessary to etch the interference mirror. As shown in FIG. 3, this is achieved very simply by replacing the continuous metal layer CM by a pellet or spot PM, likewise made of metal, and having a diameter of the order of a few wavelengths. Beneath the pellet CM, the electric field penetrates into the dielectric stack as in the situation described above; in contrast, no penetration occurs outside the perimeter of said pellet. This results in the electromagnetic energy being confined in three dimensions: it is thus possible to speak of "zero-dimensional Tamm plasmon mode". So far as the inventors are aware, this effect has never previously been observed or predicted.

The pellet PM may be circular, elliptical, or present any other shape, even a shape with sharp angles. Under such circumstances, the term "diameter" is no longer appropriate and the more general "lateral dimensions" is used. It is even possible to use a metal pellet of long and narrow shape, in which case the Tamm mode is confined in only two dimensions ("a one-dimensional Tamm mode").

This concept has been verified experimentally. FIGS. 4A to 4D show zero-dimensional Tamm plasmon mode spectra for pellets PM all having the same thickness of 60 nm and different diameters (5 µm; 2.5 µm; 1.8 µm; 1.7 µm). For each diameter, several modes can be observed; the first three are considered below. The graph of FIG. 4E shows that the energy of these modes depends on the diameter of the pellet PM; the crosses represent experimental data, and the lines represent the results obtained on the basis of a theoretical model that takes the field confined under the pellet PM into consideration. The agreement between theory and experiment is very satisfactory, thereby demonstrating the reality of the confinement in three dimensions. In fact, the confinement in the x-y plane is substantially the same as that observed in a micropillar; in the z direction, the confinement is even better than that of a micropillar presenting a $\lambda$ cavity, by about 30%. As shown in FIG. 4E, good confinement can be obtained by using a pellet of diameter that is less than or equal to 5 µm, or less than or equal to 2.5 µm. There is no real upper limit on the diameter of the pellet PM; nevertheless the effects of the confinement are barely perceptible if the diameter exceeds about 10 µm (and more generally: 10$\lambda$).

It is important to emphasize that the confinement in the x-y plane is obtained merely by depositing a metal pellet on a dielectric or semiconductive stack, without any need for deep etching.

Figure 5:
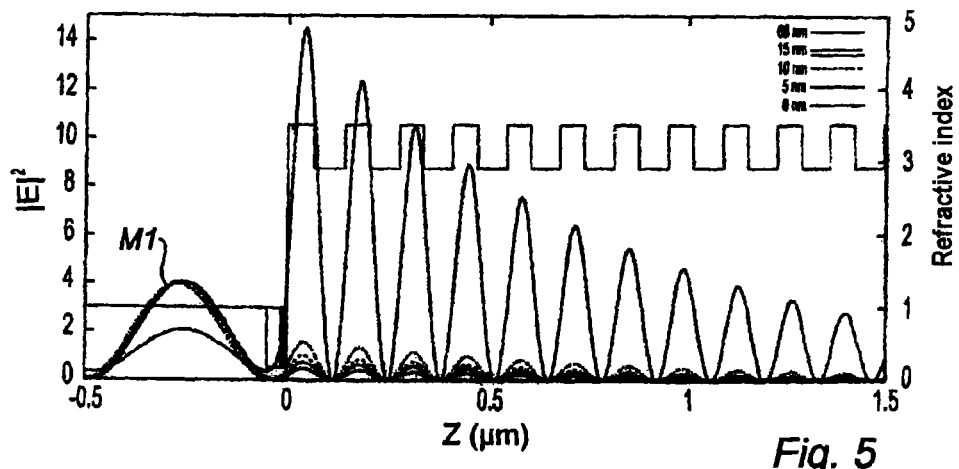
FIG. 5 is a graph illustrating the confinement mechanism of a Tamm plasmon mode in the three spatial dimensions.

FIG. 5 shows the distribution of the field at the energy of a two-dimensional Tamm plasmon mode for a metal thickness of 60 nm, and also the distribution of the field at the same energy for structures presenting metal layers CM' of smaller thicknesses. It can be observed that the field penetrates little into the dielectric for a thickness of less than about 20 nm; a thickness in the range 40 nm to 60 nm or more is required in order to obtain satisfactory confinement of the electromagnetic energy in the z direction. The thickness must not be too great (greater than about 100 nm, depending on the type of metal used) if it is desired to be able to extract the electromagnetic energy from the cavity through the pellet PM. In contrast, if energy extraction takes place from the interference mirror end, there is no upper limit on the thickness of the pellet PM.

Figure 6A:
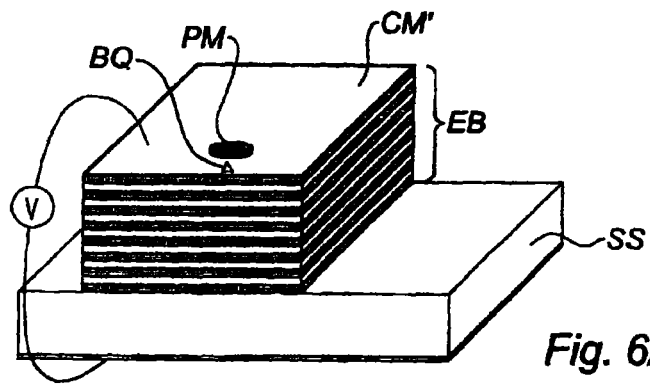
FIGS. 6 to 12 show light sources in various embodiments of the invention.
Figure 6B:
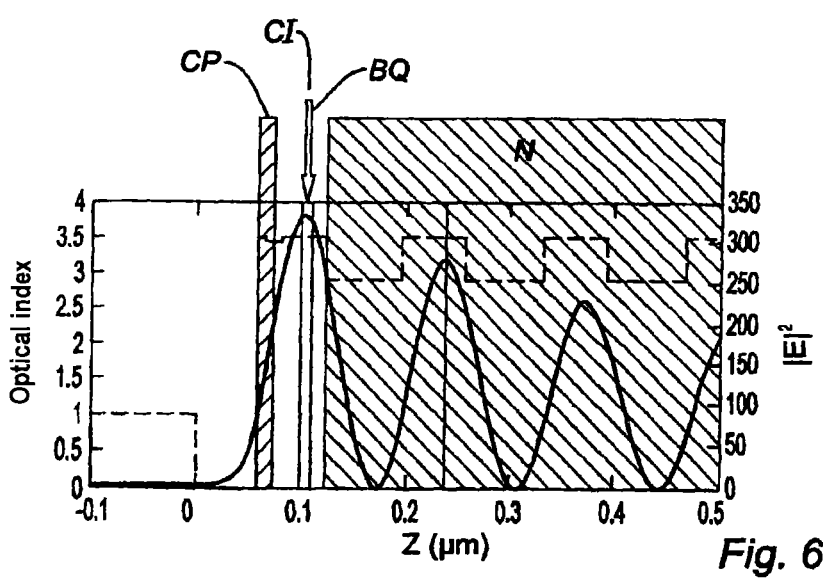

FIGS. 6A and 6B show a light source in a first embodiment of the invention; more particularly it is a source of single photons, comprising an optical microcavity based on a zero-dimensional Tamm mode and a quantum dot light emitter resonant with said microcavity.

Starting from the bottom, the FIG. 6A device comprises:

A conductive substrate SS.

A multilayer stack EB made up of alternating layers of GaAs and AlAs having respective thicknesses of $\lambda/4n_{GaAs}$ and $\lambda/4n_{AlAs}$, forming an interference mirror that is made up of three sections:

- A first section of substantially periodic structure constituted by N-doped semiconductor layers with a crenellated doping profile. The doping is stronger in correspondence with amplitude minima of the electric field of the Tamm plasmon mode, so as to minimize losses induced by free carriers.
- A second section, constituted by an intrinsic semiconductor layer CI containing quantum dots BQ of InGaAs that emit at a wavelength of 900 nm.
- A third section, constituted by thin layer CP of P-doped semiconductor. This thus produces a P-I-N structure that enables quantum dots to be pumped electrically. It should be observed that because of the layers CI and CP, the stack EB is not perfectly periodic. This does not fundamentally alter the physics of Tamm plasmon modes.

A metal pellet PM having a thickness of 50 nm that is centered over a quantum dot BQ. The pellet PM is preferably of gold or silver since the very high conductivity of these metals serves to minimize losses.

A metal layer CM' of smaller thickness (20 nm or less) is deposited on the surface of the stack EB all around the pellet PM. This layer is too thin to be capable of supporting a Tamm plasmon mode (see the graph of FIG. 5) and therefore does not compromise the three-dimensional confinement of the electromagnetic energy. Nevertheless, since it covers the entire top surface of the stack EM, having lateral dimensions that are of the order of hundreds of micrometers, it greatly facilitates the application of a potential difference to the terminals of said stack. The metal pellet PM may be made very simply in the form of extra thickness in the layer CM'.

The multilayer stack EB, including its last two sections, is fabricated by epitaxial growth on the substrate SS. The layer CI contains a random distribution of quantum dots, and they may be located by means of an optical technique that is described in the article by A. Dousse et al., "Controlled light-matter coupling for a single quantum dot embedded in a pellet microcavity using far-field optical lithography", Phys. Rev. Lett. 101, 267404 (2008). Once a quantum dot having the desired emission wavelength has been identified, the metal pellet PM is deposited vertically over it using a conventional photolithographic technique. The light source as fabricated in this way is individualized by cutting out a block of dimensions that are sufficiently large (of the order of several tens to several hundreds of micrometers) to make it easier to manipulate, with this being done by deep etching of the stack and possibly also of the substrate. Finally, the layer CM' is also deposited on the surface of the stack.

By forward biasing the P-I-N diode formed by the various layers of this stack, an electron-hole pair is injected into the quantum dot BQ. This pair may recombine in radiative manner by emitting a photon. Given that the quantum dot BQ is inside an optical resonator, the photon is preferentially emitted in a mode of said resonator (Purcell effect). It is therefore extracted much more easily from the structure. It is of interest to observe that because of the plasmon-photon coupling, the light can be extracted from the cavity directly through the metal pellet PM, in spite of its relatively large thickness.

The inverse structure (stack of P-doped layers, with an N-doped last layer) could also be used.

Figure 7:
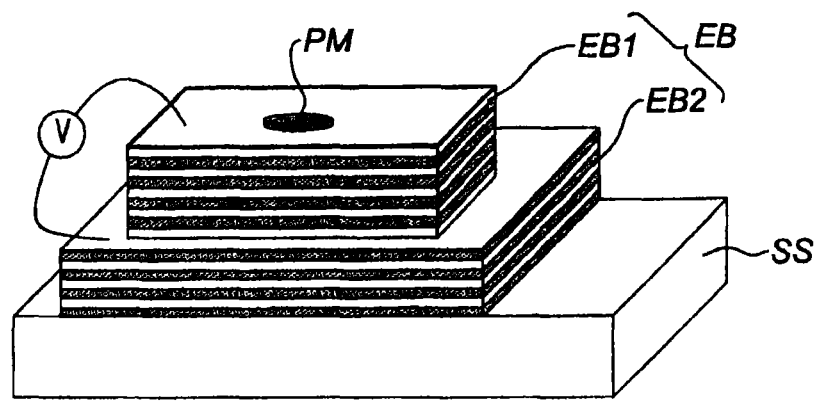

FIG. 7 shows a light source in a variant of the invention. The stack of layers forming an interference mirror is made up of two sections EB1 and EB2. The bottom section EB2 presents lateral dimensions that are greater than those of the top section EB1; a portion of its top surface is therefore exposed. A metal layer is deposited on this surface in order to form the cathode of the P-I-N diode. The advantage is to reduce the series resistance of said diode.

As explained above, the metal pellet PM may be deposited over the quantum dot BQ by a lithographic technique that comprises depositing a photosensitive resin on the surface of the stack, exposing it locally, removing the exposed resin in order to form an opening that reveals the multilayer stack, depositing a "thick" (40 nm to 60 nm) metal layer CM, removing the non-exposed resin ("lift-off") which amounts to removing the layer CM from everywhere except at the opening, and finally optionally depositing the thin metal layer CM'.

Figure 8:
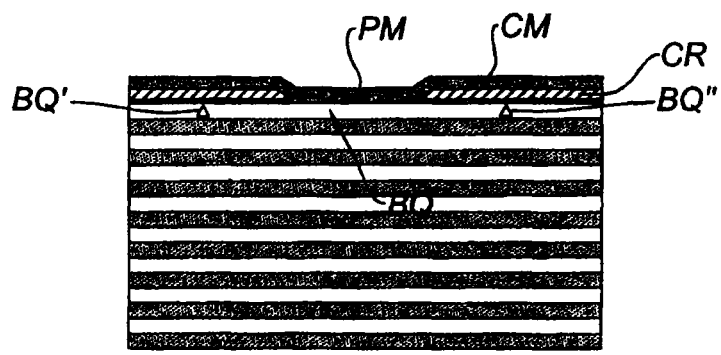

In the variant of FIG. 8, the resin is slightly under-exposed so as to create an opening with sloping edges over a quantum dot BQ, and the "lift-off" step is omitted. At the opening, the metal layer CM is in the proximity of the quantum dot; a Tamm plasmon mode can be established with minimum electric field at the emitter. This condition is not satisfied at other locations, where a thick layer of resin is interposed between the interference mirror and the metal. This variant embodiment has two advantages: firstly the fabrication process is simplified; and secondly the residual layer of resin CR attenuates by several orders of magnitude the parasitic emission from quantum dots BQ', BQ" that are located close to the quantum dot that has been selected to serve as the light emitter. In a variant, it is possible to deposit a layer of dielectric material of low refractive index compared with the refractive index of the last layer of the interference mirror, and presenting flanks similar to those of the resin shown in FIG. 8. This leads to additional complexity in the fabrication process, but it makes it possible to optimize the optical properties and the stability of the dielectric.

Figure 9:
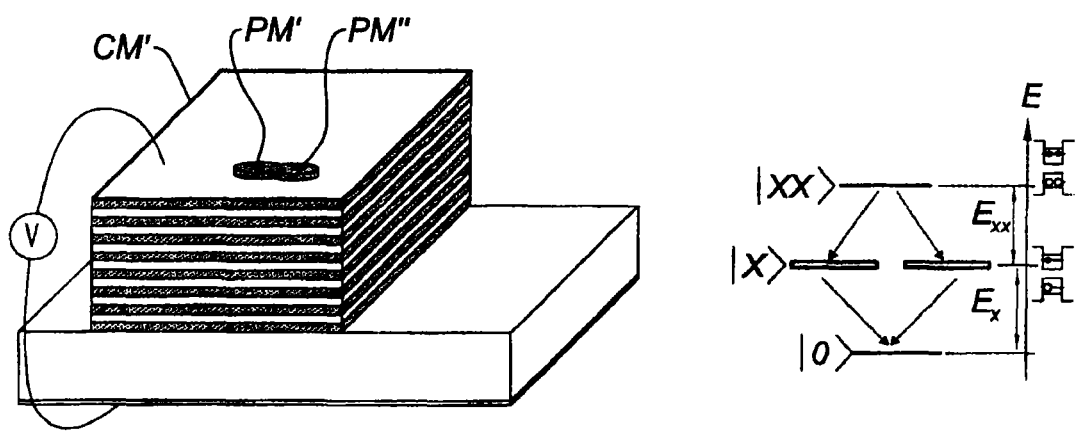

FIG. 9 shows a source of polarization-entangled photon pairs in another embodiment of the invention. This source has metal pellets PM' and PM" that overlap partially so as to form two coupled microcavities. A single quantum dot (not shown) lies under the pellet PM' only. The operating principle of this device is substantially the same as that described in the above-mentioned article by A. Dousse et al., "Ultrabright source of entangled photon pairs", Nature, Vol. 466, Jul. 8, 2010, except that the two coupled microcavities are Tamm plasmon mode cavities and not micropillars. In summary, this principle is as follows. When two electron-hole pairs are trapped in a quantum dot, two photons will be emitted in succession at two different energies, $E_{XX}$ for the biexciton-exciton transmission ($|XX\rangle \rightarrow |X\rangle$), and $E_X$ for the exciton-ground transition ($|X\rangle \rightarrow |0\rangle$), since the interaction between the carriers trapped within the quantum dot is different depending on whether two (exciton) or four (biexciton) carriers are present. The biexciton XX is a state in which spin is not defined. In contrast, the exciton X can present two states with different spins: "upward" electron spin and "downward" hole spin, or vice versa. The transition from the biexciton state to a first exciton state is accompanied by the emission of a photon of energy $E_{XX}$ that is circularly polarized to the right; thereafter the transition to the ground state is accompanied by the emission of a photon of energy $E_X$ that is circularly polarized to the left. Conversely, the transition from the biexciton state to the second exciton state is accompanied by the emission by a photon of energy $E_{XX}$ that is circularly polarized to the left; and then the transition to the ground state is accompanied by the emission of a photon of energy $E_X$ that is circularly polarized to the right. Depending on the geometrical properties of the quantum dot, the two exciton spin states may or may not be degenerate. If they are degenerate (i.e. when the energy difference between the two states, although not zero, is less than their necessarily finite width), then the two possible recombination paths between the biexciton state XX and the ground state 0 cannot be distinguished and the photons that are emitted are polarization-entangled. When the energy difference between the two exciton states is greater than the width of the transitions, the photons that are emitted are polarization-correlated but they are not entangled. When two cavities are close together, their evanescent electromagnetic fields overlap in part. Coupling appears between the two cavities and new optical modes are defined. The sizes (diameters) of the individual cavities can then be selected to obtain a resonant wavelength that is intermediate between the two wavelengths of the biexciton-exciton transition and of the exciton-fundamental transition. The distance between the two cavities then makes it possible to lift the degeneracy between the two coupled cavity modes and to match said modes to the energies $E_X$ and $E_{XX}$. This enables the two photons to be extracted efficiently by the Purcell effect. The polarization degeneracy of the two coupled cavities is obtained by using metal pellets that are substantially circular in order to confine the Tamm modes.

Figure 10:
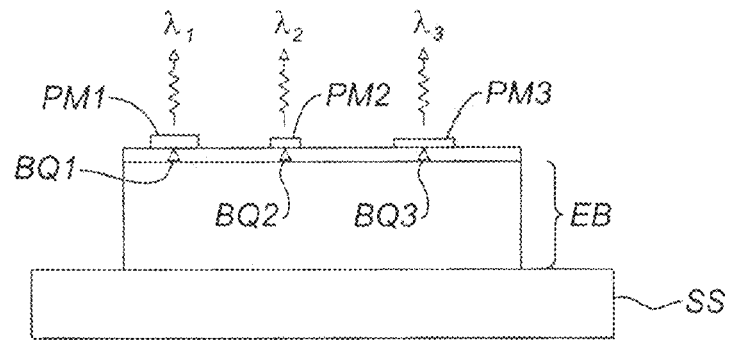

As shown in FIG. 10, a plurality of metal pellets PM1, PM2, PM3, . . . , may be deposited over respective quantum dots BQ1, BQ2, BQ3, . . . in a single device. The various quantum dots may present emission wavelengths $\lambda_1$, $\lambda_2$, $\lambda_3$, . . . that are different from one another; the diameter, the thickness, and/or the chemical composition (gold, silver, other) of the various pellets can then be selected so as to provide tuned microcavities. As also shown in FIG. 4E, the energy of the Tamm mode depends on the physical and geometrical properties of the pellet. This serves to obtain a polychromatic light source.

Above consideration is given solely to the situation in which the active element of the light source or sensor is a quantum dot, however that is not an essential limitation. The optical transducer coupled to the Tamm mode microcavity may also be a quantum well or quantum wire, a structure having multiple quantum wells, or a single P-N junction or a light-emitting heterojunction, a layer of fluorescent or phosphorescent molecules, or even a heat source. It may be any kind of emitter or detector suitable for being integrated in a Tamm plasmon mode cavity.

Figures 11A, 11B:
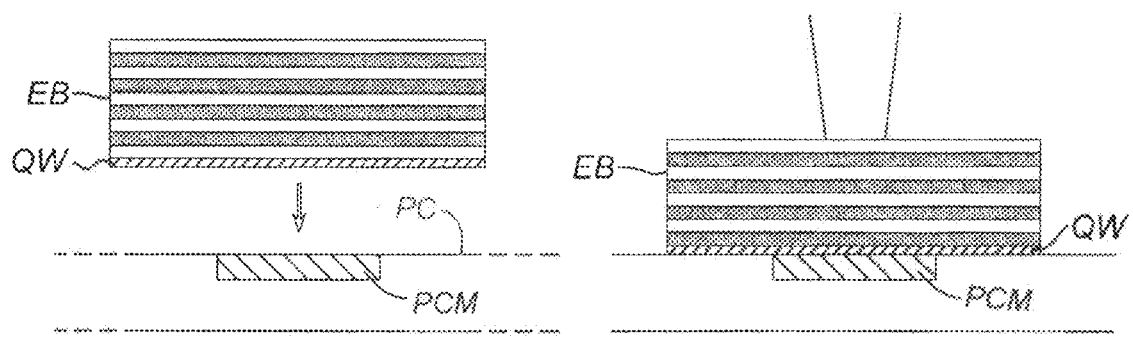

FIGS. 11A and 11B show the invention applied to fabricating a VCSEL. Such lasers are advantageous in that they make it possible to produce dense two-dimensional arrays of microlasers for optical interconnection applications. In order to avoid the need for external contacts that might affect the dynamic properties of such lasers, VCSELs are generally transferred onto a chip (by the "flip-chip" technique) that already has the metal connections and the control system. Fabricating such arrays of VCSELs is particularly complex: in addition to the fabrication proper of the lasers—which involves steps of etching, planarization, making contacts—it also requires the VCSELs to be aligned with the contacts of the control chip, with this generally being performed by a technique involving indium beads. This step is particularly critical and requires expensive equipment.

The use of zero-dimensional Tamm plasmon modes makes it possible to simplify the fabrication of such microlaser arrays considerably. As shown in FIG. 11A, it suffices to make a semiconductor stack forming an interference mirror EB that has a quantum well forming layer (or a multiple quantum well structure) QW close to its surface or at the maximum of the electromagnetic field. Thereafter, this assembly is transferred to the control chip PC that has metal connection tabs PCM, typically made of gold because of its low losses. The tabs serve both as electrical contacts and as metal pellets enabling the Tamm plasmon mode of the laser cavity to appear by forming a Tamm state. As a result no alignment is necessary since the cavity is created automatically at the same location as the electrical contact. The complete structure is shown in FIG. 11B. It should be observed that, under such circumstances, light is extracted from beside the interference mirror and not from beside the pad or metal pellet; that is why this stack must be made on a substrate that is transparent (not shown).

The use of Tamm plasmon modes for creating an optical cavity also makes it possible to simplify making light sources (LEDs, or even lasers) that are circularly polarized. It is known that it is possible to obtain polarized light emission by injecting spin-polarized carriers (in particular electrons) into a quantum well or quantum dot. Such "spin injection" can be obtained by means of magnetized ferromagnetic electrodes. Nevertheless, the electrons are easily depolarized while being transported through a semiconductor material; it is therefore necessary for the emitter to be as close as possible to the magnetic electrode. This is difficult to make compatible with optical microcavities of the prior art, but it can be achieved very naturally by depositing a pellet PFM, on a semiconductor interference mirror EB, which pellet PFM in turn presents a multilayer structure, comprising, from the bottom up:

an insulating layer CT, e.g. of MgO or $Al_2O_3$ of thickness lying in the range 1 nm to 10 nm, forming a tunnel barrier;

a very fine layer CMA (thickness in the range 1 nm to 10 nm) of a first magnetic metal, and more precisely of a magnetized ferro- or ferrimagnetic metal (typically Fe, Co, Ni, or a magnetic alloy of these elements); and a thicker layer CMC (thickness of 30 nm or more) made of a more conductive metal (Au, Ag, . . . ) that serves to minimize losses.

The insulating layer CT may be omitted.

Figure 12:
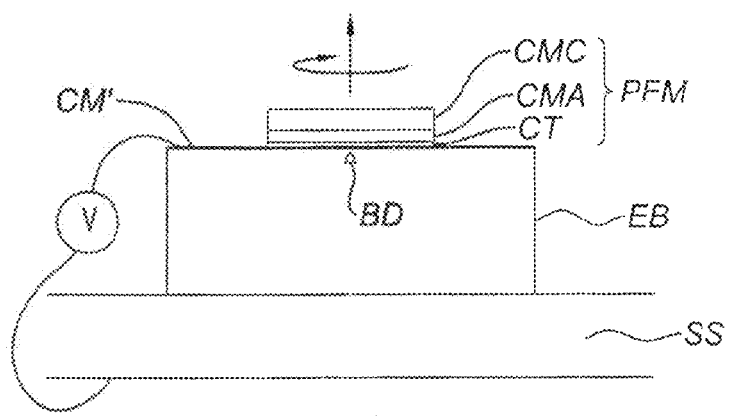

The pellet PFM serves both as a spin injector and as a metal pellet for forming a Tamm plasmon mode cavity. This structure is shown in FIG. 12.

Only light sources are described in detail above, however generalization to sensors is immediate. The devices described above as sources are also capable of absorbing light and can be used as sensors merely by reversing the bias voltage. In particular, the source of FIG. 12 can be used as a polarized light sensor, that is sensitive only to the right circular or left circular components of the incident electromagnetic radiation.

The invention claimed is:

1. A light source or sensor comprising:
a stack of dielectric or semiconductive layers comprising an alternation in a vertical direction of layers of high refractive index and of low refractive index forming an interference mirror, and presenting a top layer of high refractive index;
at least one first metal pellet deposited or transferred on the top layer of the stack of layers to form a structure supporting a first Tamm plasmon mode that is spatially localized in at least one lateral direction perpendicular to the vertical direction; and
at least one light emitter or detector arranged inside the stack of layers under the metal pellet and at a depth corresponding to a local maximum of the electric field of the Tamm plasmon mode to emit or detect radiation at the resonant wavelength $\lambda$ thereof.

2. A light source or sensor according to claim 1, wherein the or each metal pellet presents lateral dimensions that are less than or equal to $10\lambda$, or less than or equal to $5\lambda$, so as to support a Tamm plasmon mode that is localized in three dimensions.

3. A light source or sensor according to claim 1, wherein the or each metal pellet presents a thickness greater than or equal to 40 nm.

4. A light source or sensor according to claim 1, wherein the stack of layers presents lateral dimensions greater than or equal to $30\lambda$, or greater than or equal to $100\lambda$.

5. A light source or sensor according to claim 1, wherein the layers of the stack are made of one or more semiconductor materials that are doped so as to establish electrical contact between the light emitter or detector and a first electrode.

6. A light source or sensor according to claim 1, wherein a conductive layer of thickness that is not sufficient for supporting the first Tamm plasmon mode is deposited on the stack of layers.

7. A light source or sensor according to claim 1, further comprising a dielectric layer deposited on the multilayer stack, the dielectric layer including an opening over the light emitter or detector, a metal layer being deposited over the dielectric layer to form the pellet at the opening.

8. A light source or sensor according to claim 1, wherein the light emitter or detector is selected from a quantum dot, a quantum wire, and a quantum well.

9. A light source or sensor according to claim 8, wherein the light emitter or detector is situated in an intrinsic region of a P-I-N junction.

10. A light source according to claim 1, further comprising a second metal pellet adjacent to the first metal pellet, or partially overlapping the first metal pellet, so as to form a structure supporting a second Tamm plasmon mode that is localized in three dimensions and that is coupled with the first Tamm plasmon mode.

11. A light source according to claim 10, wherein the light emitter is a quantum emitter presenting a ground state, two states with one elementary excitation, which states are degenerate and of different spins, and one state with two elementary excitations, and wherein the first and second metal pellets are selected to be of substantially circular shape and of chemical composition, size, and relative arrangement such as to enable them to support a first pair of Tamm plasmon modes that are polarization degenerate and resonant with transitions between the state having two elementary excitations and the two degenerate states having one elementary excitation of the quantum emitter, and a second pair of Tamm plasmon modes that are polarization degenerate and resonant with transitions between the degenerate states having one elementary excitation and the ground state, whereby the source is capable of emitting pairs of photons that are polarization-entangled.

12. A light source according to claim 1, wherein the metal pellet is a connection pad on a surface of a chip on which the stack of layers forming an interference mirror with the light emitter is transferred.

13. A light source or sensor according to claim 1, comprising a plurality of pellets of different chemical compositions and/or thicknesses and/or lateral dimensions to form structures that support respective Tamm plasmon modes at different frequencies, and emitters or detectors placed under the pellets and resonant with the modes.

14. A light source or sensor according to claim 1, wherein the or each pellet comprises a layer made of a first metal that is magnetic and magnetized, on which there is deposited a layer made of a second metal that is of higher conductivity.

15. A light source or sensor according to claim 14, wherein the or each pellet further comprises a layer of insulating material forming a tunnel barrier under the layer made of the magnetized magnetic first metal.

* * * * *